US005334031A

United States Patent [19]
Schmidt

[11] Patent Number: 5,334,031
[45] Date of Patent: Aug. 2, 1994

[54] CONTACT DEVICE FOR AN ELECTRICAL COMPONENT AND METHOD FOR MANUFACTURE

[75] Inventor: Juergen K. Schmidt, Neuss, Fed. Rep. of Germany

[73] Assignee: Minnesota Mining and Manufacturing Company, St. Paul, Minn.

[21] Appl. No.: 1,303

[22] Filed: Jan. 6, 1993

[51] Int. Cl.⁵ ............................................. H01R 9/09
[52] U.S. Cl. .................................... 439/83; 439/161; 439/887
[58] Field of Search ............... 439/83, 161, 876, 886, 439/887, 889

[56] References Cited

U.S. PATENT DOCUMENTS

| | | | |
|---|---|---|---|
| 4,687,269 | 8/1987 | Dubertret et al. | 439/161 |
| 4,969,829 | 11/1990 | Sato | 439/83 |
| 4,980,245 | 12/1990 | Marino | 439/887 |

Primary Examiner—P. Austin Bradley
Attorney, Agent, or Firm—Gary L. Griswold; Walter N. Kirn; David W. Anderson

[57] ABSTRACT

A contact device for an electrical component, particularly a connector, comprising at least one contact element, said contact element having a first contact portion located within said component and second contact portion projecting downwardly beyond said component and adapted to be connected to a conductor, in particular a conductor of a printed circuit board, by soldering, wherein the first contact portion consists of a resilient metallic material and the second contact portion consists of a shape memory alloy, the alloy having a transformation temperature which is significantly higher than the operation temperature of the contact device, the contact device being located or oriented such that it deforms towards said conductor above said transformation temperature.

8 Claims, 3 Drawing Sheets

CONTACT DEVICE FOR AN ELECTRICAL COMPONENT AND METHOD FOR MANUFACTURE

The invention refers to a contact device for an electrical component, particularly a connector.

BACKGROUND OF THE INVENTION

In the design of electrical or electronic circuitry, considerable saving of space can be realized by placing the electrical or electronic components directly on the printed circuit board, particularly by connecting the contacts of the components directly to printed conductors on the surface of the printed circuit board. In this case, it is not necessary to provide apertures in the printed circuit board to accommodate pin contacts projecting from the component.

Prior art contacts suffer from mechanical stresses at the soldering joints caused by the connection of the contacts to the printed circuit boards. During the soldering process, heat applied may result in bending of the printed circuit board so that mechanical stresses may result at the soldering joints after cooling. Due to the irregularities of the printed circuit boards such as roughness, the components to be soldered must be pressed against the printed circuit board to assure that all contact portions safely engage the conductors of the printed circuit board. After soldering, stresses are left in the external contact portions at the soldering joints.

Soldering is usually carried out at temperatures up to 250° C. Due to different temperature expansion factors, the parts shrink differently which also results in stresses on the solder joints after cooling. Temperature variations also build up stresses at the soldering joints.

The mentioned problems occur particularly where a connector is provided with a large number of contact elements.

British patent application GB 2 173 652 and European patent application EP 0 200 449 teach to make the contact portions to be soldered flexible in a specific manner. This reduces the mechanical stresses at the soldering joints to some extent, however, the main problems mentioned above are not solved.

As will be explained in more detail, the present invention makes use of alloys having a so-called shape memory. Such alloys are generally described by "Legierungen mit Formgedachtnis", Vol. 259 Kontakt & Studium Werkstoff by Dieter Stockel, expert verlag. In such alloys, the martensitic texture transforms into an austenitic texture above a transformation temperature. A re-transformation into the martensitic texture takes place when the temperature goes below the transformation temperature, with a temperature hysteresis taking place; i.e., the re-transformation begins at a predetermined temperature below the transformation temperature. If such a shape memory alloy is trained in a suitable manner, the shape trained is attained again when the alloy is heated up to the transformation temperature.

In the mentioned book, also the application of such alloys to electrical contacts is described. A suitable shaped part of such an alloy co-operates with a contact element of resilient material. The interconnection between complementary contact elements is made when the part having the shape memory is in the martensitic phase and is deflected by the spring force of the contact element. In the austenitic phase, the spring force of the contact element is overcome by the shape memory alloy and thus establishes an intimate contact between the contact elements. Such a contact device eliminates the use of solder material. In such applications, the transformation temperature is reached at room temperature.

Japanese patent application (1984) 218757 discloses the use of shape memory material for the leads of semiconductors. In this case, the shape memory serves to straighten the leads so that they can be threaded into holes of a printed circuit board.

From the Japanese patent application (1990) 30197, it is known to use a shape memory alloy for the leads of a component to be connected to a printed circuit board and to bend the leads after the insertion into the holes of the circuit board in order to retain the components in the holes through friction. If thereafter the leads are heated up to transformation temperature, e.g. during soldering, the leads straighten so that the solder may flow completely around the leads.

Japanese patent application (1990) 116151 discloses to combine leads of a shape memory alloy with an element of resilient material. The resilient material biases the lead away from the printed circuit board, and the memory alloy material of the lead deflects the element towards the printed circuit board above the transformation temperature.

SUMMARY OF THE INVENTION

The invention provides a contact device for an electric or electronic component, particularly a connector which is flexible in the area of a soldering joint on, for example, a printed circuit board in order to reduce the mechanical stresses on the soldering joint.

The contact device according to the invention has a contact element made of two separately manufactured contact portions which are interconnected in a suitable manner, e.g. by soldering, crimping or the like. The first contact portion may of a suitable resilient metallic material usually used with connectors, such as $CuSn_8$ or $CuBe_2$. The second contact portion consists of a shape memory alloy having a transformation temperature significantly above the operating temperature of the contact device. The second contact portions are arranged such that it is deformed towards a conductor on the printed circuit board above its transformation temperature. If the contact device according to the invention is placed on the printed circuit board and soldered, the solder heats the second contact portion above its transformation temperature. The second contact portion then deforms towards the printed circuit board. Furthermore, it is subjected to a significant strengthening in the austenitic phase. This assures that the contact portion overcomes the surface tension of the solder and a safe soldering joint is achieved. With the contact device according to the invention, it is not required to clamp the component against the printed circuit board to compensate for tolerances. It is merely necessary to hold the component against the printed circuit board which for example can be carried out by adhering the component to the printed circuit board. Tolerances of the component, if any, are automatically compensated by the deformation of the second contact portion above transformation temperature.

If cooling takes place after the soldering process, the second contact portion returns into the martensitic phase and becomes relatively soft. According to an embodiment of the invention, the alloy and/or the cross section of the second contact portion is selected such that no significant force which may stress the soldering joint is exerted by the second contact portion. Preferably, below transformation temperature the second contact portion has a ductility which can be compared with that of copper. If the contact device is subject to mechanical stresses or if thermal stresses occur, they are not exerted on the soldering joint to a considerable extent.

The second contact portion may have different geometric configurations. According to one embodiment of the invention, the second contact portion may include a laterally extending arm. The arm has an orientation such that it is bent towards the printed circuit board if heated above transformation temperature. In order to achieve resilient behavior during the austenitic phase, the arm can be provided with a loop-shaped portion.

In the contact device according to the invention, the second contact portion needs to be oriented only in one direction, namely towards the printed circuit board. In case the second contact portion is manufactured of wire, the orientation cannot be recognized from a length cut from the wire. For automatic manufacture of the contact device, recognition of the orientation is mandatory. Therefore, a method for the manufacture of the second contact portion for the contact device according to the invention provides that a wire of a shape memory alloy is provided with a geometric mark extending in the longitudinal direction prior to or after training of the material. The mark has a predetermined relation to the orientation of the wire after training. For example, flat wires can be used. Since a flat wire can be bent to opposite sides, one or both sides have to be marked, e.g. by a suitable ink, to allow an oriented connection to the first contact portion by suitable means.

According to another embodiment of the invention, a round wire can be used which can be manufactured more simply as generally known. The round wire can be provided with a flattening or a groove which has a predetermined relation to the orientation of the wire.

BRIEF DESCRIPTION OF THE DRAWINGS

The invention is subsequently described with reference to the drawings, wherein.

DETAILED DESCRIPTION OF THE DRAWINGS

Figure 1:
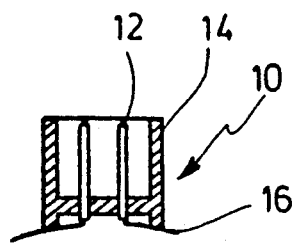
FIG. 1 is a cross section through the housing of a connector including a conventional contact device.
Figure 2:
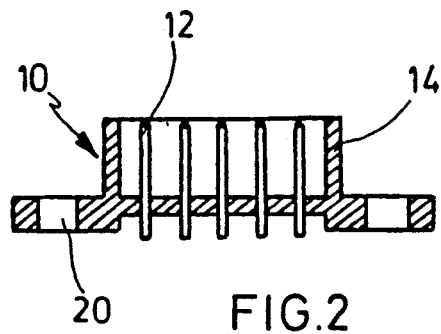
FIG. 2 shows a cross section through the housing of FIG. 1 turned about 90°.
Figure 3:
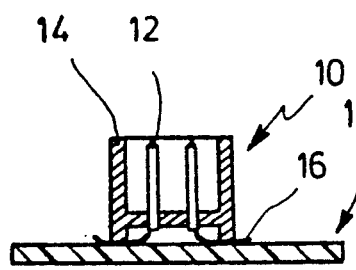
FIG. 3 shows an illustration similar to FIG. 1 during the attachment of the connector to a printed circuit board.
Figure 4:
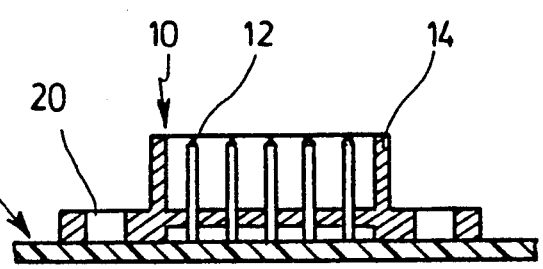
FIG. 4 shows an illustration similar to FIG. 2 during the connection of the connector to the printed circuit board.
Figure 5:
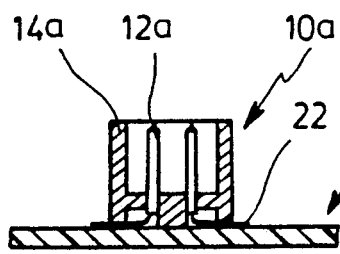
FIG. 5 shows a cross section through a connector including a contact device according to the invention during the placement on a printed circuit board.
Figure 6:
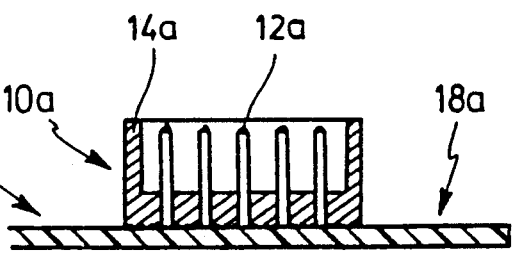
FIG. 6 shows a cross section through the connector of FIG. 5 turned about 90°.

FIG. 1 shows a connector 10 having a plurality of contact pins 12 located in a housing 14. The contact pins 12 are provided with cantilevered tails 16 at the lower ends thereof which are bent downwardly. The connector 10 is mounted to a printed circuit board 18 (FIGS. 3 and 4). The housing 14 has lateral extensions including bores 20 which allow the fastening of housing 14 to printed circuit board 18 by fasteners such as bolts or screws. Upon attachment, the tails 16 are deformed upwardly and engage the printed circuit board 18 under resilient pressure. Subsequently, soldering takes place in the known manner.

The contact pins 12 are of suitable resilient material, e.g. $CuSn_8$. It can be seen that stresses in the contact pin 12 or the tail 16, respectively, immediately effect the soldering joint.

Parts in FIGS. 5 to 8 similar to those of FIGS. 1 to 4 are designated with same reference numerals added with an "a". Contact pins 12a are similar to those in FIGS. 1 to 4 and can be made of the same material. The tails 22 which laterally extend from pins 12a like an arm are of a shape memory alloy, e.g. NiTi. The structure of the contact pin and the tail can be seen more clearly in FIGS. 9 to 11.

A contact pin 12b, of circular or polygonal cross section has a bore 24 at the lower end thereof. The vertical leg of the L-shaped tail 22 engages bore 24 and is fixed therein by crimping.

Figure 10:
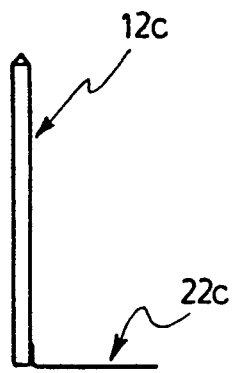
FIG. 10 shows another embodiment of a contact element according to the invention.

In the embodiment of FIG. 10, the L-shaped tail 22c is connected to the contact pin 12c by soldering.

Figure 9:
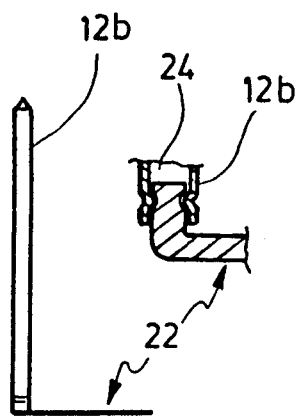
FIG. 9 is a side view of a contact element according to the invention.
Figure 11:
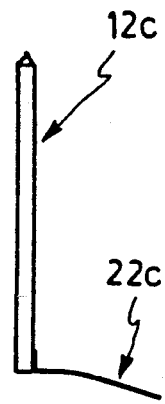
FIG. 11 shows the contact element of FIG. 10 heated above transformation temperature.

The embodiments in FIGS. 9 and 10 show a tail 22 or 22c, respectively, during operational temperature or beneath the transformation temperature of the alloy. This may be 200° C., for example. If heating up to transformation temperature takes place, e.g. by soldering, the material of tail 22c is transformed to the austenitic phase and attains the shape trained wherein it is bent downwardly (FIG. 11).

Figure 7:
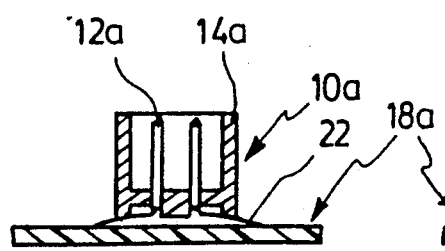
FIG. 7 shows an illustration similar to FIG. 5 during soldering of the connector to the printed circuit board.
Figure 8:
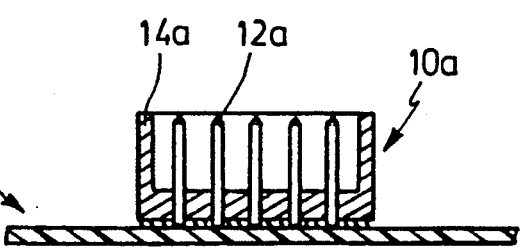
FIG. 8 shows a cross section of the connector of FIG. 7 turned about 90°.

The material of tail 22 or 22c, respectively, is relatively thin and for example consists of a wire of 0.2 mm diameter. The contact pin, however, has for example a thickness of 0.6 mm. The alloy is selected such that in the martensitic phase the material is relatively soft below the transformation temperature, e.g. has a ductility which can be compared with that of copper. If housing 14a is placed on printed circuit board 18a, tail 22 or 22c has a position as shown in FIGS. 5 to 9 and 10, i.e. approximately perpendicular to contact pin 12a or 12b or 12c. If connector 10a is soldered to printed circuit board 18a, tail 22 forms as depicted in FIG. 7. The tails exert a force on the printed circuit board 18a, so that tolerances of housing 14a or printed circuit board 18a, respectively, or irregularities due to thermal effects are compensated. After cooling, tails 22 or 22c are soft and do not produce mechanical stresses at the soldering joints.

It is not necessary to clamp housing 12a to printed circuit board 18a as is the case in the known embodiment shown in FIGS. 1 to 4. It is completely sufficient to simply adhere housing 10a to a printed circuit board 18.

Figures 12A, 12B, 12C, 12D:
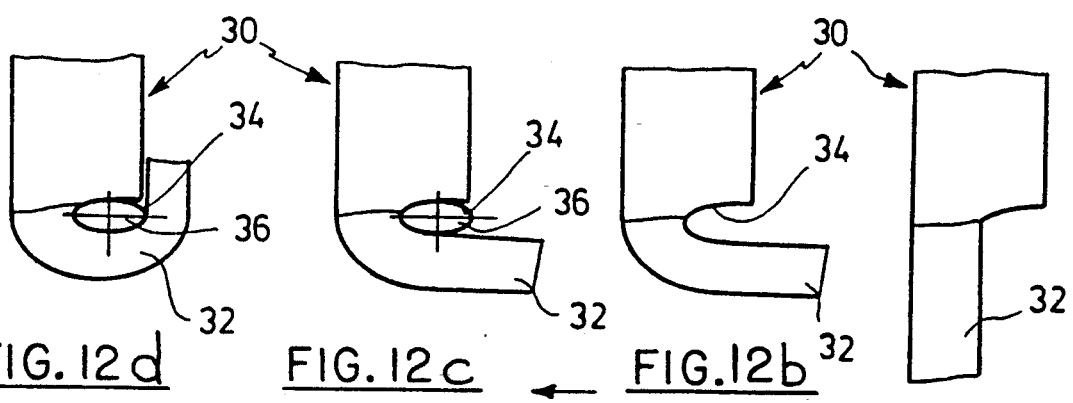
FIGS. 12(a)–12(d) show the connection of contact portions of the contact device according to the invention in individual manufacturing steps a to d.

In FIG. 12, a contact element 30 is shown having an upwardly projecting extension 32. This extension 32, as shown in FIG. 12b, can be bent about 90° and thus define a recess 34. The recess can accommodate the end of an oval contact portion 36 which consists of a shape memory alloy as described above. By bending extension 32 around contact portion 36 this can be fixedly clamped in recess 34.

Figure 13A:
FIGS. 13(a)–13(c) show different wire cross-sectional profiles for the contact portions.

In FIG. 13, three different cross-sectional profiles of a wire for the second contact portion are shown. FIG. 13a shows a flat wire which is oriented such that the bending takes place towards one of the larger surfaces upon reaching transformation temperature. In order to indicate which direction the bending takes place, one of the larger surfaces can be provided with a suitable color.

Figure 13B:

FIG. 13b shows a round wire having a flattened portion extending in the longitudinal direction. The flattened portion can have a predetermined relation to the orientation of the wire.

Figure 13C:

FIG. 13c shows also a round wire which has a V-shaped groove extending in the longitudinal direction, with the groove also having a predetermined relation to the orientation of the trained wire.

Figure 14:
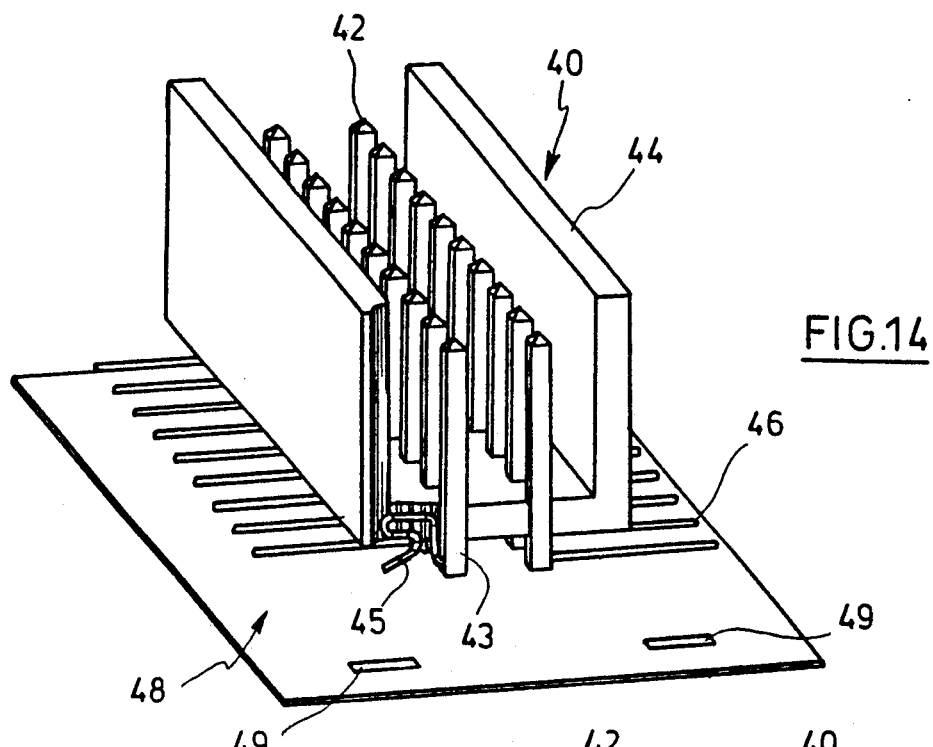
FIG. 14 is a perspective view of a connector including a further embodiment of a contact device according to the invention prior to the soldering to a printed circuit board.
Figure 15:
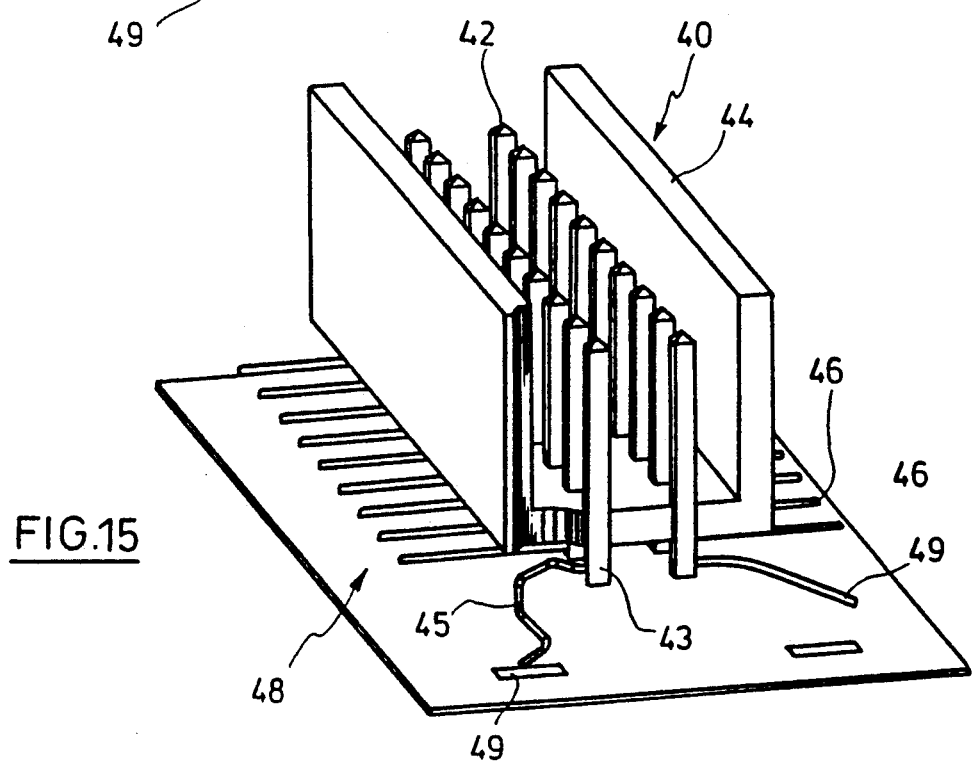
FIG. 15 shows the connector of FIG. 14 during soldering to the printed circuit board.

In FIGS. 14 and 15 a connector 40 is depicted having two rows of contact pins 42 which are retained in a suitable housing 44. Some contact pins 42 include laterally extending second contact portions 46 which can be compared with the contact portion 22 of FIGS. 5 to 8. In FIG. 15, also a downwardly bent contact portion 46 is illustrated which can be soldered to a conductor 49 on a printed circuit board 48. This process has been already described above. Furthermore, a contact pin 43 is shown including a bent second contact portion 45 located in a cavity of housing 44. Upon heating up to transformation temperature, contact portion 45 straightens and extends downwardly to engage conductor 49 under pressure.

A preferred example for a contact device is given below:

The contact pins for a connector consist of CuSm$_8$ or CuBe$_2$

The shape memory alloy consists of 55 weight-% Ni and 45 weight-% Ti

The alloy has a transformation temperature of approximately 110° C.

Generally, the shape memory temperature is to be higher than the maximum operation temperature of, for example, 85° or 100° C. The austenitic finish temperature must be lower than the melting temperature of the eutectic tin-lead-alloy of 183° or 170° C., respectively. The martensitic start temperature should be as near as possible below the austenitic finish temperature in order to diminish the stresses during cooling as much as possible. The martensitic finish temperature must be above the maximum operation temperature of, for example, 85° or 110° C., respectively. Finally, the indicated temperatures have to be selected in view of the respective application and the material for the shape memory alloy available.

What is claimed is:

1. A contact device for an electrical component, comprising at least one contact element, said contact element having a first contact portion located within said component and a second contact portion projecting downwardly beyond said component and adapted to be connected to a conductor, by soldering, wherein said first contact portion consists of resilient metallic material and said second contact portion consists of a shape memory alloy, said alloy having a transformation temperature which is significantly higher than the operation temperature of said component, said second contact portion including a laterally extending arm having a loop-shaped portion and said contact device being oriented such that said second contact portion is deformed towards said conductor above said transformation temperature.

2. The contact device of claim 1, wherein said transformation temperature of said alloy is reached during soldering of said component of said conductor.

3. The contact device of claim 1, wherein said first and said second contact portions are interconnected by soldering or welding.

4. The contact device of claim wherein said second contact portion has a ductility below said transformation temperature which is substantially that of copper.

5. The contact device of claim 1 wherein a method for the manufacture of the second contact portion is a wire of a shape memory alloy provided with a geometric shape having a predetermined relation to the orientation of said wire after training of said wire.

6. The contact device of claim 5 wherein said wire is rectangular in cross-section.

7. The contact device of claim 5 wherein said wire is circular in cross-section with a flattened surface parallel to the axis of said wire.

8. A contact device for an electrical component, comprising at least one contact element, said contact element having a first contact portion located within said component and a second contact portion connected to said first contact portion by crimping and projecting downwardly beyond said component and adapted to be connected to a conductor, by soldering, wherein said first contact portion consists of resilient metallic material and said second contact portion consists of a shape memory alloy, said alloy having a transformation temperature which is significantly higher than the operation temperature of said component, said contact device being oriented such that it is deformed towards said conductor above said transformation temperature.

* * * * *